United States Patent
Boughton

(10) Patent No.: US 11,533,801 B2
(45) Date of Patent: Dec. 20, 2022

(54) ATMOSPHERIC PRESSURE LINEAR RF PLASMA SOURCE FOR SURFACE MODIFICATION AND TREATMENT

(71) Applicant: CORNING INCORPORATED, Corning, NY (US)

(72) Inventor: Daniel Robert Boughton, Naples, NY (US)

(73) Assignee: CORNING INCORPORATED, Corning, NY (US)

( * ) Notice: Subject to any disclaimer, the term of this patent is extended or adjusted under 35 U.S.C. 154(b) by 51 days.

(21) Appl. No.: 16/767,837

(22) PCT Filed: Nov. 29, 2018

(86) PCT No.: PCT/US2018/063165
§ 371 (c)(1),
(2) Date: May 28, 2020

(87) PCT Pub. No.: WO2019/108855
PCT Pub. Date: Jun. 6, 2019

(65) Prior Publication Data
US 2020/0383197 A1 Dec. 3, 2020

Related U.S. Application Data

(60) Provisional application No. 62/592,799, filed on Nov. 30, 2017.

(51) Int. Cl.
*H05H 1/24* (2006.01)
*H05H 1/46* (2006.01)
*H01J 37/32* (2006.01)

(52) U.S. Cl.
CPC ............ *H05H 1/2406* (2013.01); *H05H 1/46* (2013.01); *H01J 37/3244* (2013.01);
(Continued)

(58) Field of Classification Search
None
See application file for complete search history.

(56) References Cited

U.S. PATENT DOCUMENTS

| | | | | |
|---|---|---|---|---|
| 6,087,778 A | * | 7/2000 | Benjamin | H01J 37/321 118/723 AN |
| 6,568,346 B2 | * | 5/2003 | Pu | H01J 37/321 156/345.46 |

(Continued)

FOREIGN PATENT DOCUMENTS

KR 101718515 B1 3/2017

OTHER PUBLICATIONS

Cao et al; "Atmospheric Plasma Jet Array in Parallel Electric and Gas Flow Fields for Three-Dimensional Surface Treatment," Applied Physics Letters vol. 94, 021501-1 3, (2009).
(Continued)

*Primary Examiner* — Srinivas Sathiraju
(74) *Attorney, Agent, or Firm* — Daniel J. Greenhalgh

(57) ABSTRACT

An atmospheric pressure linear RF plasma source having an enclosure enclosing a chamber in the form of an extended slot having a width W, a length L, and a thickness T, with W≥20T, the enclosure having a top opening for receiving a flow of a working gas in the direction of the length L and a bottom opening for delivering a flow of plasma, with the bottom opening being open to atmospheric pressure. Then walls of the enclosure comprise a dielectric material. Two mutually opposing pancake coils are positioned on opposite sides of the enclosure and are capable of being driven by an RF power source in an opposing phase relationship. Alternatively, an elongated solenoid coil may surround the enclosure.

20 Claims, 6 Drawing Sheets

(52) U.S. Cl.
CPC .... *H01J 37/32174* (2013.01); *H05H 2240/10* (2013.01); *H05H 2245/40* (2021.05)

(56) References Cited

U.S. PATENT DOCUMENTS

| | | | | |
|---|---|---|---|---|
| 6,825,618 | B2* | 11/2004 | Pu | H01J 37/321 |
| | | | | 315/111.41 |
| 8,222,822 | B2* | 7/2012 | Gilbert | H05H 1/46 |
| | | | | 156/345.48 |
| 8,328,982 | B1 | 12/2012 | Babayan et al. | |
| 8,377,209 | B2 | 2/2013 | White | |
| 8,551,898 | B2 | 10/2013 | Danielson et al. | |
| 9,066,413 | B2* | 6/2015 | Chang | H01J 37/32174 |
| 9,101,042 | B2* | 8/2015 | Voronin | H05H 1/46 |
| 9,406,485 | B1* | 8/2016 | Cheng | H01J 37/32091 |
| 9,550,694 | B2* | 1/2017 | Boughton | C03B 19/109 |
| 9,711,333 | B2* | 7/2017 | Sieber | H01J 37/32082 |
| 9,997,335 | B2* | 6/2018 | Jiang | H01J 37/32192 |
| 10,023,858 | B2* | 7/2018 | Canady | A61B 18/1206 |
| 10,023,961 | B2* | 7/2018 | Tixhon | H01J 37/32889 |
| 10,083,817 | B1* | 9/2018 | Godyak | H05H 1/46 |
| 10,475,628 | B2* | 11/2019 | Glukhoy | H05H 1/466 |
| 10,651,014 | B2* | 5/2020 | Roy | H01J 37/32348 |
| 10,800,092 | B1* | 10/2020 | Cheng | H05H 1/2406 |
| 10,861,669 | B2* | 12/2020 | Vandermeulen | H01J 37/147 |
| 2001/0054383 | A1* | 12/2001 | Pu | H01J 37/321 |
| | | | | 156/345.48 |
| 2003/0015965 | A1* | 1/2003 | Godyak | H01J 37/32009 |
| | | | | 315/111.21 |
| 2003/0168009 | A1* | 9/2003 | Denes | H01J 37/32743 |
| | | | | 156/345.43 |
| 2004/0118521 | A1* | 6/2004 | Pancham | H01J 37/3408 |
| | | | | 156/345.48 |
| 2004/0223579 | A1* | 11/2004 | Lee | H05H 1/46 |
| | | | | 376/123 |
| 2007/0029501 | A1* | 2/2007 | Kubota | H01J 27/16 |
| | | | | 250/423 R |
| 2007/0170996 | A1* | 7/2007 | Dutton | H01J 37/32192 |
| | | | | 331/126 |
| 2007/0230721 | A1* | 10/2007 | White | H04R 19/005 |
| | | | | 381/166 |
| 2011/0108726 | A1* | 5/2011 | Hiraoka | H05H 1/2406 |
| | | | | 250/288 |
| 2011/0199027 | A1 | 8/2011 | Kim | |
| 2012/0160806 | A1* | 6/2012 | Godyak | H05H 1/46 |
| | | | | 216/61 |
| 2012/0261391 | A1 | 10/2012 | Ihde et al. | |
| 2013/0029123 | A1 | 1/2013 | Madocks | |
| 2013/0196081 | A1* | 8/2013 | Jewett | C30B 25/105 |
| | | | | 427/578 |
| 2013/0273262 | A1* | 10/2013 | Vellaikal | C23C 16/45589 |
| | | | | 118/723 R |
| 2014/0142255 | A1* | 5/2014 | Paulauskas | H01J 37/32348 |
| | | | | 422/186.04 |
| 2014/0217894 | A1* | 8/2014 | Chen | H01J 37/32091 |
| | | | | 315/111.41 |
| 2014/0320017 | A1* | 10/2014 | Chae | H01J 37/32183 |
| | | | | 315/111.51 |
| 2016/0300696 | A1* | 10/2016 | Jiang | H01J 37/321 |
| 2016/0329191 | A1* | 11/2016 | Sieber | H05H 1/2406 |
| 2016/0329192 | A1* | 11/2016 | Sieber | C23C 16/452 |
| 2016/0329193 | A1* | 11/2016 | Sieber | H01J 37/32449 |
| 2017/0294290 | A1* | 10/2017 | Jiang | H01J 37/32357 |
| 2018/0374670 | A1* | 12/2018 | Vandermeulen | H01J 37/147 |
| 2019/0055648 | A1* | 2/2019 | Nishimura | C23C 16/50 |
| 2019/0221402 | A1* | 7/2019 | Glukhoy | H01J 37/3288 |
| 2020/0075297 | A1* | 3/2020 | Oishi | H01J 37/32834 |
| 2020/0205277 | A1* | 6/2020 | Kim | H01J 37/32449 |

OTHER PUBLICATIONS

Enercon; "Corona Treatment Expertise for Converting and Extruding Film" ; 3 pages; (1996-2020) http://www.enerconind.com/treating/corona/index.aspx.

Hubicka et al; "Barrier-Torch Discharge Plasma Source for Surface Treatment Technology At Atmospheric Pressure"; Plasma Sources Science and Technology, vol. 11 (2002), pp. 195-202.

International Search Report and Written Opinion of the International Searching Authority; PCT/US2018/063165; dated Mar. 18, 2019; Korean Intellectual Property Office.

Kukla; "The High Intensity of Openair-Plasma® Treatment Makes It Possible to Significantly Streamline the Entire Process"; Plasmatreat; 5 Pages; (2020) http://www.plasmatreat.com/plasma-treatment/plasma-pretreatment.html.

Vetaphone; "History"; 5 Pages; (2020) http://www.vetaphone.com/about/history/.

* cited by examiner

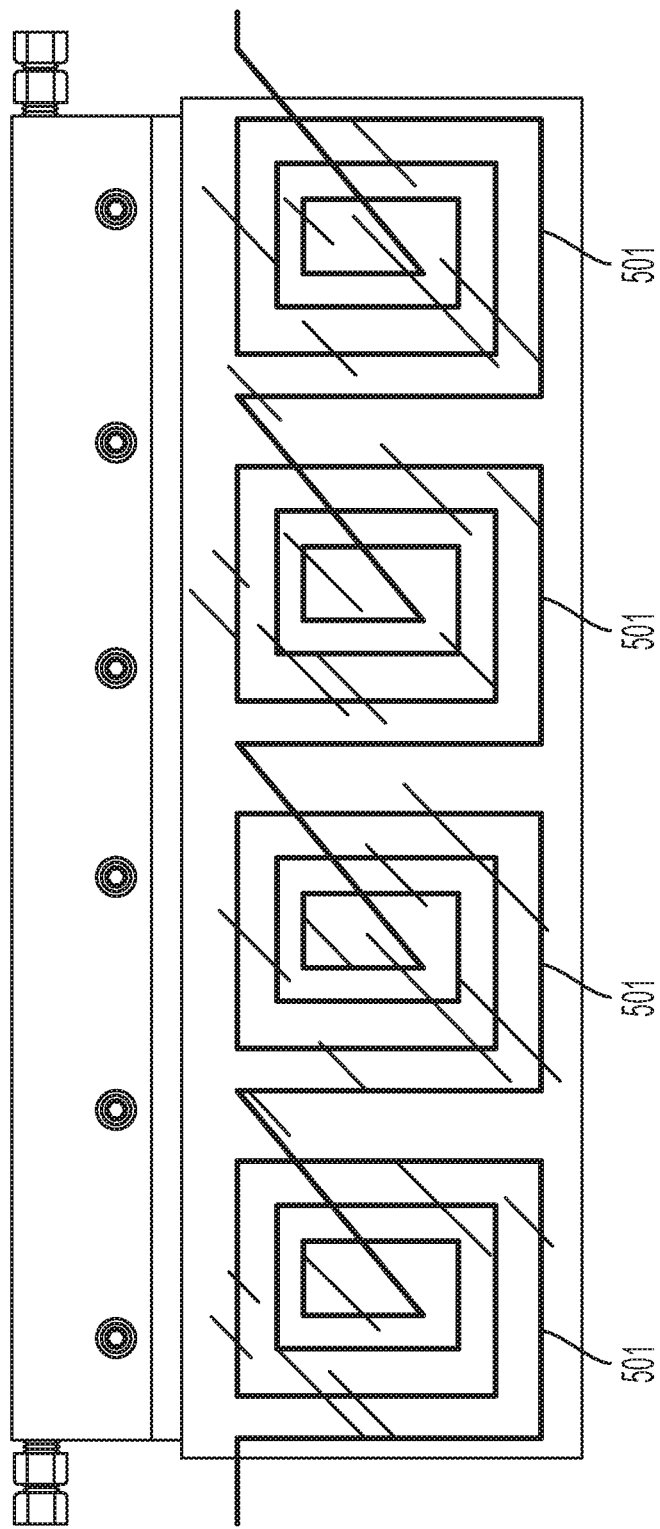

ATMOSPHERIC PRESSURE LINEAR RF PLASMA SOURCE FOR SURFACE MODIFICATION AND TREATMENT

CROSS-REFERENCE TO RELATED APPLICATIONS

This application claims the benefit of priority under 35 U.S.C. § 371 of International Application No. PCT/US2018/063165, filed on Nov. 29, 2018, which claims the benefit of priority under 35 U.S.C. § 119 of U.S. Provisional Application No. 62/592,799, filed Nov. 30, 2017, the content of each of which is incorporated herein by reference in their entirety.

FIELD

The present disclosure relates to generally to atmospheric pressure non-thermal or thermal plasma apparatuses suited for modifying the surface of substrates or wafers, and in particular to a linear, atmospheric pressure, non-thermal or thermal plasma source or "plasma knife".

BACKGROUND

Surface modification of substrates by means of corona and/or plasma discharge at atmospheric pressure has been widely used in industry for many years. In this technology a low frequency high voltage source is used to supply power to an electrode opposed by a grounded electrode. A corona discharge is formed between the two electrodes through which air is passed, causing air molecules to become ionized as they collide with the electrons flowing in the corona streams between the electrodes.

The charged particles or ions are then attracted to an oppositely charged electrode, usually positioned under the substrate to be treated. The charged particles or ions typically accelerate to a high velocity before impacting the substrate surface. In the case of a polymer substrate such as a plastic film, the impacts and/or other interactions of the charged particles break bonds in the top-most layer(s) of molecules in the plastic film. This results in an increased surface energy of the film surface, with a high degree of wettability, so that inks may be printed on and bonded to the plastic. In industry this result and/or this process is called surface activation.

Normally, untreated plastic has low surface energy causing inks to bead up and not bond to the surface. Measurement of wettability is usually determined by measurement of the contact angle of a droplet of the material being printed on the surface with lower contact angles indicating higher surface energies.

In the case of glass substrates, exposure to corona based plasma has been used for surface cleaning. Charged particles impacting the surface eject dust and other containments, leaving a cleaned surface behind.

A difficulty arises in cleaning glass surfaces when containments on the surface have their own inherent electrical attraction to the surface. Even after impacts from charged particles, industrial washing methods may still be unable to remove such contaminants. In such cases plasma processes using multiple ion species, excited at higher frequencies under reduced pressures, are often used. ISM frequencies (frequencies in the Industrial, Scientific, and Medical frequency band allocation by the FCC), such as 13.56 MHz or 27 MHz, are typical. The plasma is typically operated at reduced pressures such as $10^{-3}$ Torr. The plasma gases are usually Ar mixed with $O_2$ and/or $N_2$. In the case of organic contamination on the substrates the bombardment with ions results in the organic bonds being broken and then the $O_2$ ion species readily bonds with the carbon and effects removal of the contaminant from the substrate.

Such RF plasma processes have been highly successful for glass cleaning. However, the requirement of low pressure—treating glass substrates in vacuum conditions—adds significant capital and maintenance cost to the process. In addition, because the reactor requires time for vacuum pump down after loading a batch of substrates, time for processing, then time to bring the reactor back to atmospheric pressure for unloading, the reactor requires a relatively long production cycle. To take advantage of the ability of RF plasma to clean glass surfaces but without the low pressure requirement, industrial technology development has focused on atmospheric pressure RF plasma sources.

Atmospheric plasma sources include individual plasma jets and arrays of plasma jets. Individual jets are raster-scanned across a substrate to be cleaned. There are two drawbacks to this approach: (1) is the coverage overlap can result in non-uniform cleaning or activation from "streaking" and (2) raster scanning requires several back and forth passes adding significant cycle time to the process. Arrays of plasma jets have problems with non-uniform plasma density—plasma density is thinner between the jets. This also leads to uneven surface treatment and can require scanning in X and Y directions to produce uniform treatment of a substrate.

SUMMARY

An aspect of one embodiment of the present disclosure relates to an atmospheric pressure linear RF plasma source comprising an enclosure enclosing a chamber in the form of an extended slot having a width W, a length L, and a thickness T, with W≥20T. The enclosure has two opposing major walls enclosing the slot in a direction of the thickness of the slot, and two opposing minor walls enclosing the slot in a direction of the width of the slot. The enclosure has a top opening communicating with the slot for receiving a flow of a gas and a bottom opening communicating with the slot for delivering a flow of plasma, with the bottom opening being open to atmospheric pressure. Desirably, W≥30T, W≥40T, or even W≥ as much as 100T, or even more, as there is no physical limitation on the width of the linear plasma produced by the source of the present disclosure.

The enclosure of the source further has an interior surface comprising surfaces facing the slot of each of the major and minor walls, and an exterior surface comprising surfaces facing away from the slot of each of the major and minor walls. The two major walls of the enclosure comprise a dielectric material. Desirably the minor walls also can comprise a dielectric material.

In this aspect the source further comprises two or more pairs of pancake coils, each pair comprising a first and a second pancake coil positioned in an opposing relationship on opposite sides of the enclosure and oriented facing the outer surfaces of the major walls thereof.

In an additional aspect of this embodiment, the source can also comprise an RF power source connected to each opposing first pancake coil and second pancake coil and structured and arranged so as to be able to drive each opposing first pancake coil and second pancake coil in a directly out-of-phase (in an opposing phase) relationship.

An aspect of another embodiment of the source of the present disclosure relates to an atmospheric pressure linear RF plasma source comprising an enclosure enclosing a chamber in the form of an extended slot having a width W, a length L, and a thickness T, with W≥20T. The enclosure has two opposing major walls enclosing the slot in a direction of the thickness of the slot, and two opposing minor walls enclosing the slot in a direction of the width of the slot. The enclosure has a top opening communicating with the slot for receiving a flow of a gas and a bottom opening communicating with the slot for delivering a flow of plasma, with the bottom opening being open to atmospheric pressure. Desirably, W≥30T, W≥40T, or even W≥ as much as 100T, or even more, as there is no physical limitation on the width of the linear plasma produced by the source of the present disclosure.

The enclosure of the source further has an interior surface comprising surfaces facing the slot of each of the major and minor walls, and an exterior surface comprising surfaces facing away from the slot of each of the major and minor walls. The two major walls and the two minor walls of the enclosure comprise a dielectric material.

In this aspect the source further comprises an elongated solenoid coil surrounding the outer surface of the enclosure.

In an additional aspect of this embodiment, the source can also comprise an RF power source connected to the elongated solenoid coil.

In another additional aspect of any of the above embodiments, the source can also comprise an air knife connectable to a supply of working gas, with the air knife having an air knife output slot positioned to deliver a flow of working gas into the enclosure through the top opening of the enclosure.

In another additional aspect of any of the above embodiments, the first and second major walls can comprise quartz. Desirably the minor walls also can comprise quartz.

In another additional aspect of any of the above embodiments, T is selected so as to allow the source to be capable of providing a laminar flow of plasma from the lower opening of the enclosure.

In another additional aspect of any of the above embodiments, T is selected so as to allow the source to be capable of providing a laminar flow of plasma extending from the lower opening of the enclosure a distance of in the range of from 1 to 3 cm.

In another additional aspect of any of the above embodiments, T is selected so as to allow the source to be capable of providing a laminar flow of plasma extending from the lower opening of the enclosure a distance of in the range of from 2 to 3 cm.

Additional features and advantages are set forth in the Detailed Description that follows, and in part will be apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which:

FIG. 6 shows a side view drawing of an embodiment employing dual pancake coils connected in series (with one side, or one of the two dual series-connected coils, visible in the figure).

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

References to directions such as up, down, front, back, left, and right and/or to directional features such as top, bottom, front, back, left side, and right side are for relative reference within the drawings as drawn only, or for relative reference within the described or claimed feature or apparatus, and are not to be understood as limiting the orientation of the described features, but only the relative positioning of such features within an arbitrary frame of reference.

Figure 1:
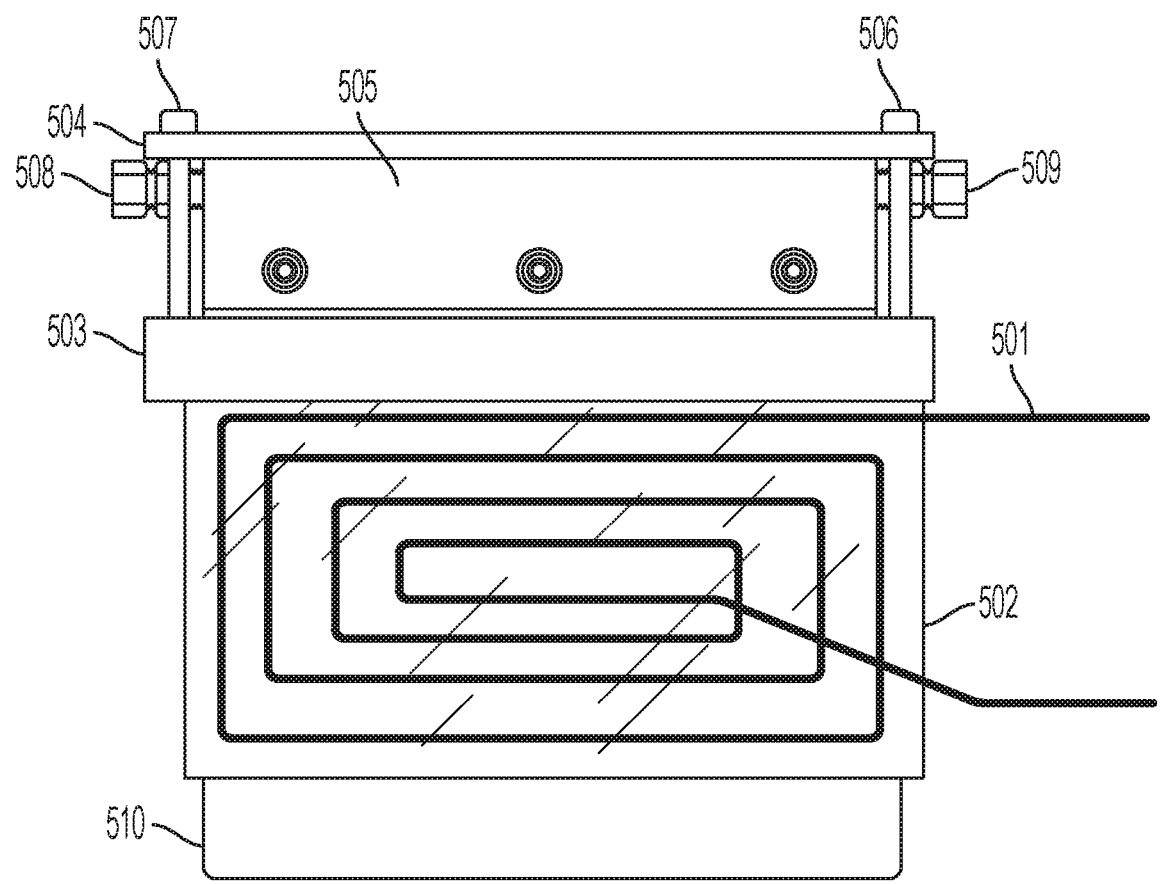
FIG. 1 shows a side view drawing of a linear RF plasma source according to an embodiment of the present disclosure.

FIG. 1 shows a side view drawing of a linear RF plasma source according to an embodiment of the present disclosure in which 501 shows the dual pancake inductor, 502 shows the quartz plate assembly, 503 is the ceramic air knife and quartz assembly union or joint. 504 is the ceramic air knife clamp which holds the air knife 505 and the air knife quartz assembly union 503 together by means of two pairs of bolts 506 and 507. Plasma working gas is fed in inlet fittings 508, 509 where from both directions the gas inside the air knife 505 equilibrates in pressure, providing a uniform curtain flow of gas through the exhaust nozzle. 510 is the resulting linear plasma plume exiting the quartz plate assembly.

Figure 2:
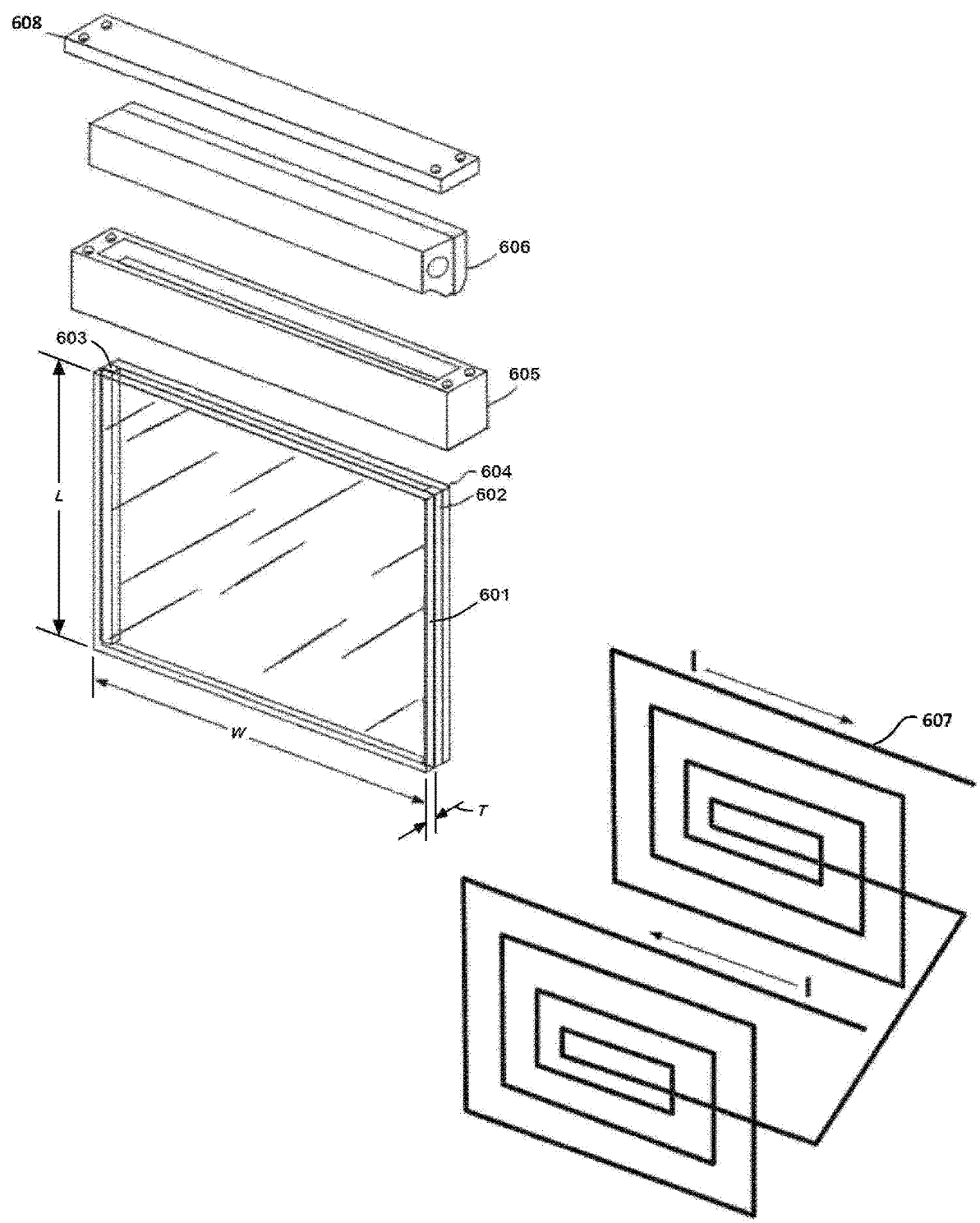
FIG. 2 shows an isometric exploded view of the linear RF plasma source shown in FIG. 1.

FIG. 2 shows an isometric exploded view of the linear RF plasma source shown in FIG. 1. 601 is the plasma gas flow front quartz plate in the assembly with the rear quartz plate 604 and the quartz support spacers 602 and 603. 605 is the ceramic air knife quartz assembly union, 606 is the commercially available air knife, and 607 is the ceramic air knife clamp, and 608 is the dual pancake RF inductor.

With reference to FIGS. 1 and 2, an embodiment of a plasma source according to the present disclosure develops a linear RF plasma by means of source of uniform line flow of gas, such as a commercially available device known as an "air knife" which is labeled in FIGS. 1 (505), and 2 (606). The air knife produces a gas flow typically from compressed air in its common usage, fed on both ends with equal pressure and exiting the air knife as a curtain of gas. The gas as it exits the air knife becomes turbulent which would produce non-uniform plasma, so the curtain of gas leaving the air knife is passed through a slot produced by two dielectric plates, desirably quartz plates (601,604) in FIGS. 2 and 502 in FIG. 1, separated by spacers, desirably quartz rod spacers (depicted as 602 and 603 in FIG. 2).

In an example embodiment, the quartz plates are 175 mm in width×102 mm in length×2 mm in thickness each, and the quartz rod spacers are 102 mm×4 mm×4 mm, thus forming an enclosure enclosing an extended slot of width W of 167 mm, a length L of 102 mm and a thickness T of 4 mm. The directions of the width W, the length L, and the thickness T of the quartz plates 601, 604, the spacers 602, 603, and the extended slot are indicated generally with reference to the front quartz plate 601 shown in FIG. 2 for clarity. The 102 mm height was found by experiment to be optimal for the laminar flow with a commercial air knife—when delivering $CO_2$ used for thermal imaging at a rate of 30-45 slpm. However, since commercial air knives are available in several lengths, the quartz plates can be extended in length to treat and activate much wider area substrates, so the width W of the extended slot is not limited to the 167 mm. The 4 mm slot thickness T was found by experiment to have the correct thickness T to prevent the curtain of gas from turning turbulent in the case of the example embodiment, which resulted in a laminar flow with uniform density for a distance of 2-3 cm below the exit of the slot. At flow of at least in the range of 1-3 cm is desirable, and 2-3 is more desirable. This thickness T may be adjusted both above and below 4 mm to accommodate scalability in size and surface exposure for larger area substrates as the application and the working gases may require. Notable is that the ratio of width to thickness W/T of the extended slot and the experimentally demonstrated resulting linear plasma or "plasma knife" was 167/4 or greater than 40:1. Desirably, the dimensions of the extended slot are provided such that $W \geq 20T$, $W \geq 30T$, $W \geq 40T$, $W \geq 50T$, or even $W \geq 100T$, or higher, as there is no fundamental limit on the potential increase in width versus of the extended slot of the present device and the resulting "plasma knife."

Instead of compressed air as in a typical air knife, a working gas such as argon is used to produce plasma. Working gasses such as argon, helium, nitrogen or oxygen and/or various combinations thereof may be used. The quartz plates 602, 603 act as dielectric separators keeping the plasma away from the RF induction coils and by virtue of their spatial structure, confine the plasma to a specific shape and volume.

The plasma may transition from an E-mode, which is electric field dominant, to an H-mode or magnetic field dominant by means of increasing the RF power applied to the inductor, and as a consequence the plasma will transition from a non-thermal to thermal plasma. Experiment has shown that >600 W power will increase the plasma temperature to the point where thermal shock of the quartz plates is very likely. Therefore, additional water cooling of the quartz plates can be required to prevent the occurrence of thermal shock. Deionized coolant water with resistivity maintained in the 1018 Ohm range needs is used to prevent RF power coupling into the coolant water and unnecessarily heating it, resulting in a power drain from the plasma.

Figure 3:
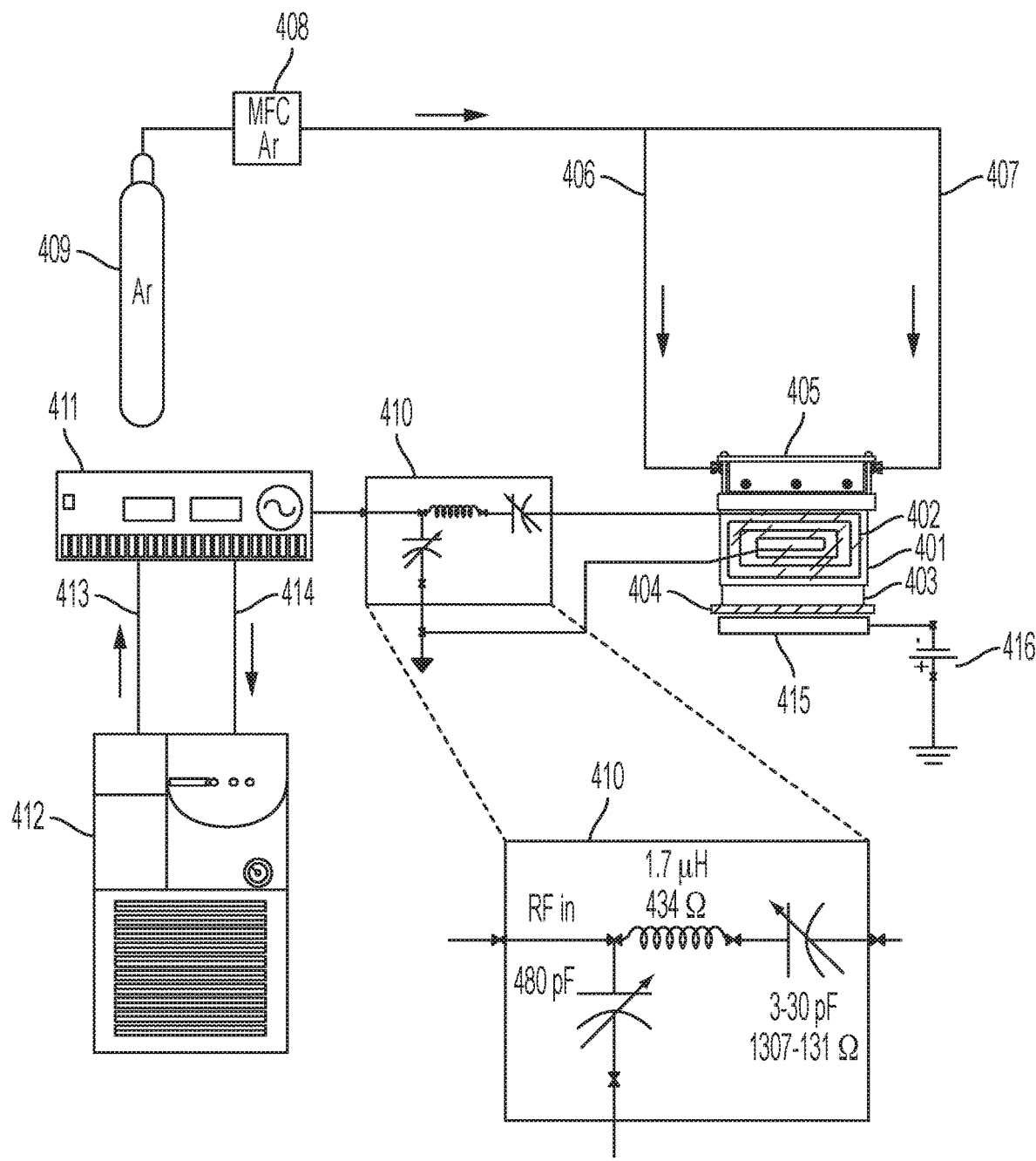
FIG. 3 shows an embodiment of a basic infrastructure system such as may be used to operate various embodiments of a linear RF plasma source of the present disclosure.

FIG. 3 shows an embodiment of a basic infrastructure system such as may be used to operate various embodiments of a linear RF plasma source of the present disclosure, and such as was used to operate an example embodiment. In FIG. 3, 401 is a quartz plate assembly, 402 is a dual pancake RF inductor, 403 is the resultant linear RF plasma, 404 is a substrate to be treated, 405 is a commercial air knife, 406 is the left hand side plasma working gas inlet, 407 is the right hand side plasma working gas inlet, 408 is the plasma working gas mass flow controller, 409 is the plasma working gas delivery source, 410 is the autotuning RF impedance matching network, 411 is RF power generator with a frequency which could be in the range of 1 MHz to 100 MHz, 412 is the chiller used for cooling the water coolant for the RF generator, matching network, RF coil, and linear RF plasma source, 413 is the coolant outlet and 414 is the coolant inlet. Below the substrate being treated an optional DC bias electrode 415 may be used to direct the ions in the plasma to the substrate for enhanced treatment. The DC bias electrode is connected to a DC power supply 416, desirably having a voltage that can range from 500 VDC to 30 kVDC.

The atmospheric pressure line plasma in the example 150 mm line plasma source may be initiated by flowing a plasma working gas such as argon at a flow rate of 5 slpm to 45 slpm, turning on the RF source which can be from 500 kHz to 40 MHz and tuning the matching network connected to the RF inductor to 500 W forward power and 0 watts reflected power. A spark from a piezoelectric source or a Tesla spark coil is then introduced into the plasma working gas that is flowing in the RF electromagnetic field. The spark starts the electron neutral atom cascade (electron avalanche) ionization process. The plasma is then self-sustaining at that point as long as the RF power and the plasma gas flow rate are maintained. Both RF power and plasma gas flow may be adjusted to optimize the plasma characteristics for the required process. Plasma characteristics can be measured either through optical emission spectroscopy or by means of a platinum tipped Langmuir probe. A substrate to be processed is then passed through the line plasma at constant velocity which may be anywhere from 1 mm/s to 1000 mm/s. The processing may involve multiple passes or may be single pass, as may be required by the application for effective treatment.

Figure 4A:
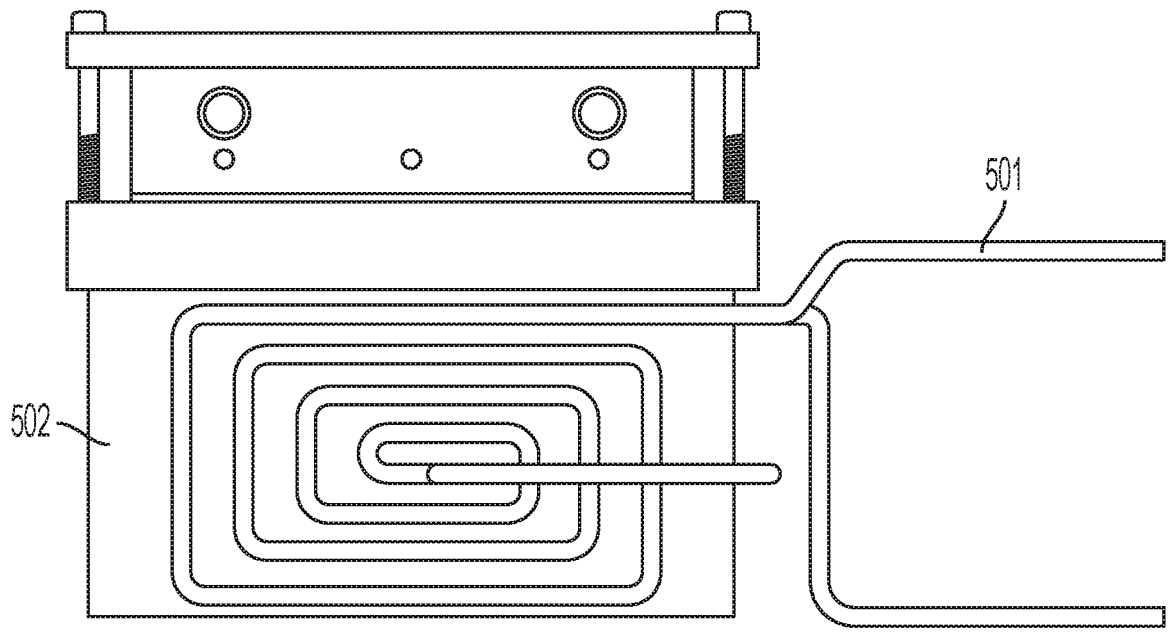
FIGS. 4A and 4B show a 3D rendering of an embodiment employing a dual pancake RF coil structure.
Figure 4B:
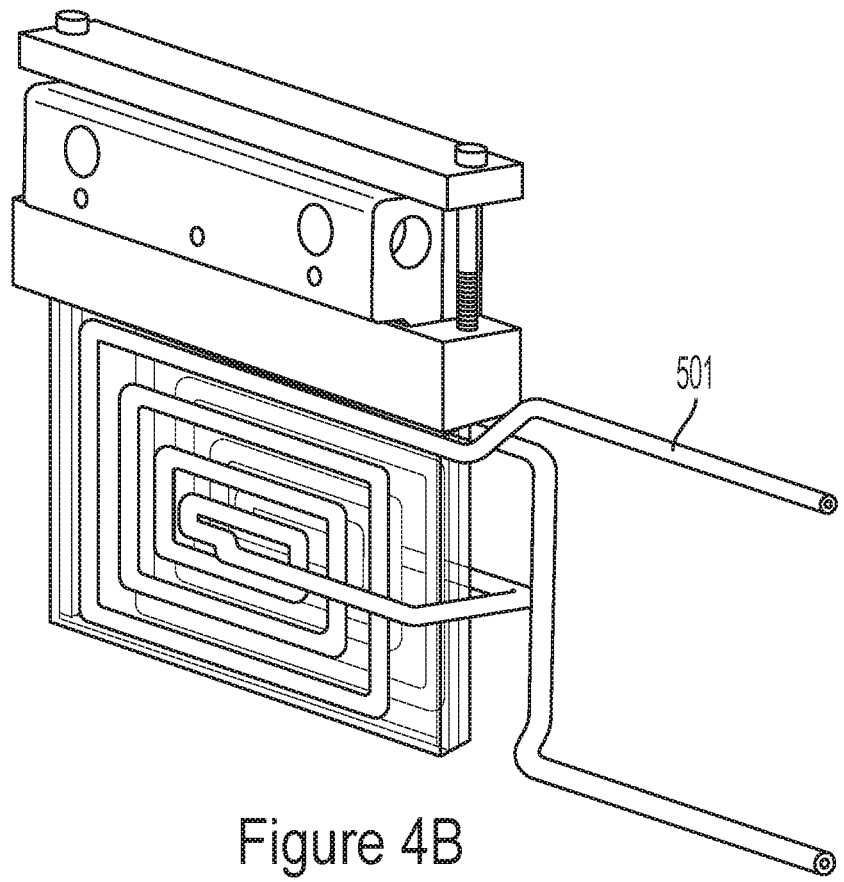

FIGS. 4A and 4B show a 3D rendering of an embodiment employing a dual pancake RF coil structure, using the same reference characters as in FIG. 1. Pancake coils tend to be less efficient than a solenoid shaped coil when used alone, but in the present embodiments using pancake coils the pancake coils on either side of the quartz plate slot are driven out of phase with one another. This produces a tightly confined electric field and causes the magnetic fields of the two coils to oppose each other (to "buck"), forcing the plasma to the center between them. This results in more energy-dense plasma capable of doing more work on the substrate surface per unit time. In addition, the electric field forms in a direction straight from one coil to the other with higher field density passing through the plasma gas causing a high degree of excitation.

Figure 5A:
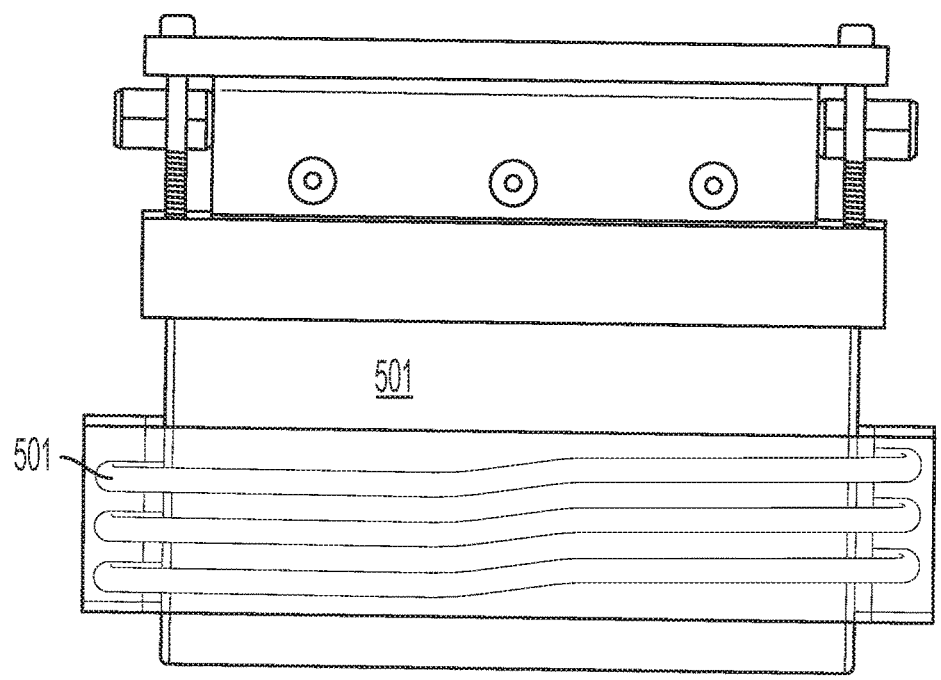
FIGS. 5A and 5B show a 3D rendering of an embodiment employing a solenoid-shaped RF coil structure.
Figure 5B:
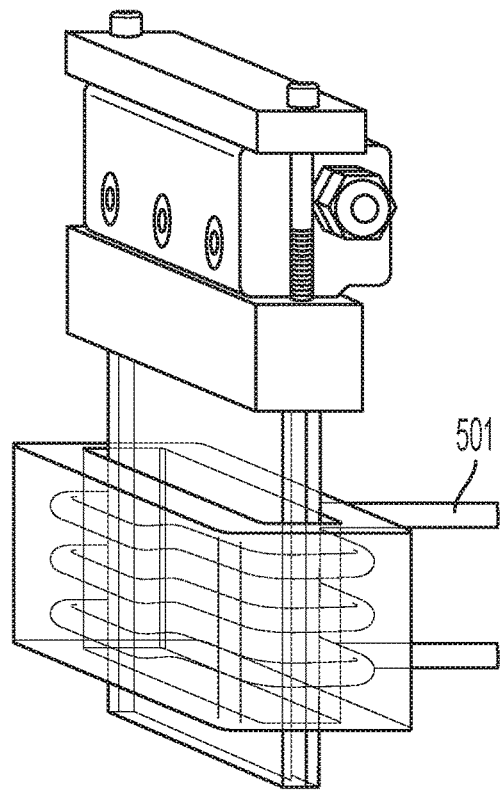

Shown in the 3D renderings of FIGS. 5A and 5B, using the same reference characters as in FIG. 1, is an alternative embodiment employing a solenoid-shaped RF inductor.

As a further alternative embodiment shown in a side view drawing in FIG. 6, dual pancake coils 501 may be connected in series as so that a wider line source may be produced and still maintain a high degree of plasma density, uniformity, and energy. Several pancake coils 501 in series can be mirrored with pancake coils in series on the opposite side of the quartz plates and driven out of phase to produce the same benefits as the dual pancake coils 501 shown in FIGS. 2 (reference 608) and 4A, 4B (reference 501).

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. An atmospheric pressure linear RF plasma source comprising:
    an enclosure enclosing a chamber in the form of an extended slot, the slot having a width W, a length L, and a thickness T, with W≥20T, the enclosure having two opposing major walls enclosing the slot in a direction of the thickness of the slot, and two opposing minor walls enclosing the slot in a direction of the width of the slot, the enclosure having a top opening communicating with the slot for receiving a flow of a gas, the enclosure having a bottom opening communicating with the slot for delivering a flow of plasma, the bottom opening being open to atmospheric pressure, the enclosure having an interior surface comprising surfaces facing the slot of each of the major and minor walls and an exterior surface comprising surfaces facing away from the slot of each of the major and minor walls, the two major walls of the enclosure comprising a dielectric material; and
    two or more pairs of pancake coils connected to each other in a planar arrangement on the enclosure, each pair comprising a first and a second pancake coil positioned in an opposing relationship on opposite sides of the enclosure adjacent to the surfaces of the major walls corresponding to the exterior surface.

2. The source according to claim 1 further comprising an RF power source connected to each opposing first pancake coil and second pancake coil and structured and arranged so as to be able to drive each opposing first pancake coil and second pancake coil in an out-of-phase (opposing phase) relationship.

3. The source according to claim 1 further comprising an air knife connectable to a supply of working gas, the air knife having an air knife output slot positioned to deliver a flow of working gas into the enclosure through the top opening of the enclosure.

4. The source according to claim 1 wherein the first and second major walls comprise quartz.

5. The source according to claim 1 wherein W≥30T.

6. The source according to claim 1 wherein W≥40T.

7. The source according to claim 1 wherein W≥100T.

8. The source according to claim 1 wherein T is selected so as to allow the source to be capable of providing a laminar flow of plasma from the lower opening of the enclosure.

9. The source according to claim 1 wherein T is selected so as to allow the source to be capable of providing a laminar flow of plasma extending from the lower opening of the enclosure a distance of in the range of from 1 to 3 cm.

10. The source according to claim 1 wherein T is selected so as to allow the source to be capable of providing a laminar flow of plasma extending from the lower opening of the enclosure a distance of in the range of from 2 to 3 cm.

11. An atmospheric pressure linear RF plasma source comprising:
    an enclosure enclosing a chamber in the form of an extended slot, the slot having a width W, a length L, and a thickness T, with W≥20T, the enclosure having two opposing major walls enclosing the slot in a direction of the thickness of the slot, and two opposing minor walls enclosing the slot in a direction of the width of the slot, the enclosure having a top opening communicating with the slot for receiving a flow of a gas, the enclosure having a bottom opening communicating with the slot for delivering a flow of plasma, the bottom opening being open to atmospheric pressure, the enclosure having an interior surface comprising surfaces facing the slot of each of the major and minor walls and an exterior surface comprising surfaces facing away from the slot of each of the major and minor walls, the two major and the two minor walls of the enclosure comprising a dielectric material; and
    an elongated solenoid coil surrounding the outer surface of the enclosure.

12. The source according to claim 11 further comprising an RF power source connected to the elongated solenoid coil.

13. The source according to claim 11 further comprising an air knife connectable to a supply of working gas, the air knife having an air knife output slot positioned to deliver a flow of working gas into the enclosure through the top opening of the enclosure.

14. The source according to claim 11 wherein the first and second major walls comprise quartz.

15. The source according to claim 11 wherein W≥30T.

16. The source according to claim 11 wherein W≥40T.

17. The source according to claim 11 wherein W≥100T.

18. The source according to claim 11 wherein T is selected so as to allow the source to be capable of providing a laminar flow of plasma from the lower opening of the enclosure.

19. The source according to claim 11 wherein T is selected so as to allow the source to be capable of providing a laminar flow of plasma extending from the lower opening of the enclosure a distance of in the range of from 1 to 3 cm.

20. The source according to claim 11 wherein T is selected so as to allow the source to be capable of providing a laminar flow of plasma extending from the lower opening of the enclosure a distance of in the range of from 2 to 3 cm.

* * * * *

UNITED STATES PATENT AND TRADEMARK OFFICE
CERTIFICATE OF CORRECTION

| | |
|---|---|
| PATENT NO. | : 11,533,801 B2 |
| APPLICATION NO. | : 16/767837 |
| DATED | : December 20, 2022 |
| INVENTOR(S) | : Daniel Robert Boughton |

It is certified that error appears in the above-identified patent and that said Letters Patent is hereby corrected as shown below:

In the Claims

In Column 7, Line 48, in Claim 8, delete "Tis" and insert -- T is --.

In Column 8, Line 3, in Claim 10, delete "Tis" and insert -- T is --.

In Column 8, Line 40, in Claim 18, delete "Tis" and insert -- T is --.

In Column 8, Line 43, in Claim 19, delete "Tis" and insert -- T is --.

Signed and Sealed this
Twenty-ninth Day of August, 2023

Katherine Kelly Vidal
*Director of the United States Patent and Trademark Office*